United States Patent [19]

Tanaka et al.

[11] Patent Number: 5,760,439

[45] Date of Patent: Jun. 2, 1998

[54] SEMICONDUCTOR MEMORY DEVICE

[75] Inventors: Haruo Tanaka; Yukio Shakuda, both of Kyoto, Japan

[73] Assignee: Rohm Co., Ltd., Kyoto, Japan

[21] Appl. No.: 806,629

[22] Filed: Feb. 26, 1997

Related U.S. Application Data

[63] Continuation of Ser. No. 527,352, Sep. 12, 1995, abandoned.

[30]  Foreign Application Priority Data

Sep. 14, 1994  [JP]  Japan ................... 6-219893

[51] Int. Cl.$^6$ ........................ H01L 29/788
[52] U.S. Cl. ............... 257/323; 257/433; 257/680; 257/681; 257/80; 257/82; 257/85
[58] Field of Search ................. 257/680, 681, 257/434, 433, 323, 79, 80, 81, 82, 84, 98, 85

[56] References Cited

U.S. PATENT DOCUMENTS 5,338,944  8/1994  Edmond et al. ................... 257/77

FOREIGN PATENT DOCUMENTS

| 0015351 | 1/1986 | Japan . | |
|---|---|---|---|
| 0290770 | 12/1986 | Japan . | |
| 0296564 | 12/1987 | Japan . | |
| 63-012181 | 1/1988 | Japan | 257/796 |
| 0143996 | 6/1990 | Japan . | |
| 0267689 | 10/1993 | Japan . | |

*Primary Examiner*—Tom Thomas
*Assistant Examiner*—David B. Hardy
*Attorney, Agent, or Firm*—Nikaido, Marmelstein Murray & Oram LLP

[57] ABSTRACT

A semiconductor memory device in which a stored information can be simply erased only by an electric signal so as to be rewritten is provided. The semiconductor memory device includes: (a) a semiconductor chip having an array of memory cells, stored information in the memory cells being erasable by light irradiation; (b) a light emitting element irradiating a light into the memory cells portion of the semiconductor chip; and (c) a package in which the semiconductor chip and the light emitting element are encapsulated with a resin in one body.

6 Claims, 4 Drawing Sheets

SEMICONDUCTOR MEMORY DEVICE

This application is a continuation of application Ser. No. 08/527,352 filed Sep. 12, 1995, now abandoned.

BACKGROUND OF THE INVENTION

The present invention relates to a semiconductor memory device such as an EPROM in which stored information is erased by light irradiation such as an ultraviolet ray irradiation, and more particularly to a semiconductor memory device including a light emitting element, thereby stored information is electrically erased.

Heretofore, an EPROM has been widely employed as a memory device into which users can electrically write information. In order to rewrite information electrically, however, it is necessary to entirely erase the information by irradiating mainly ultraviolet rays. For this reason, in a semiconductor memory device such as an EPROM, as shown in FIG. 6 and FIG. 7 which is a sectional view taken along the line B—B of FIG. 6, a package comprising an opaque resin 1 has inconveniences that the package must be provided with a window 6 for the ultraviolet ray irradiation, that an expensive ceramic package must be prepared, and that the manufacture of the package requires a complex packaging process. Now, in FIG. 6 and FIG. 7 reference numeral 2 designates a lead wire; 3, a semiconductor chip; and 4, a wire such as a gold wire. Further, in order to irradiate ultraviolet rays to erase the information, there is a troublesome work that a semiconductor memory device having been once mounted on a printed board must be removed from the printed board. As a memory device instead of such an EPROM, there have been developed an electrically erasable and writable flash memory, an EEPROM and the like. However, due to a complexity in the structure of the semiconductor memory itself, such a high density memory as a flash memory or an EEPROM has not been manufactured at such low cost as an ultraviolet ray erasable EPROM.

As described above, the conventional ultraviolet ray erasable semiconductor memory has problems that the package must be provided with a window for the ultraviolet ray irradiation, and that in erasing information, the memory device must be removed from the printed board, subjected to the ultraviolet ray irradiation, and then must be mounted again onto the printed board.

SUMMARY OF THE INVENTION

The present invention is made to solve the problems such an ultraviolet ray erasable semiconductor memory device has, and it is an object of the invention to provide a semiconductor memory device which is encapsulated in a package having no special window, and in which the information can be simply erased only by an electric signal so as to be rewritten electrically.

In a semiconductor memory device of the present invention, said device comprises:

(a) a semiconductor chip having an array of memory cells, stored information in the memory cells being erasable by light irradiation;
(b) a light emitting element irradiating a light into the memory cells portion of the semiconductor chip; and
(c) a package in which the semiconductor chip and the light emitting element are encapsulated with a resin in one body.

If the semiconductor chip is provided on the reverse side of a substrate of the light emitting element, then such configuration is preferable since the semiconductor chip and the light emitting element can be assembled in a stable manner.

If a plurality of the light emitting elements may be encapsulated, and are arranged in such a manner that respective lights from such a plurality of the light emitting elements are irradiated to each of parts of the memory cells of the semiconductor chip, and at the same time, a light insulating wall is provided in such a manner that the lights from respective elements are not intersected with each other, then such configuration is preferable because stored information can be rewritten electrically for each of the different memory array regions.

It is preferable that the above-mentioned light emitting element is the one using a gallium nitride type compound semiconductor, since the wavelength is short and the energy is strong.

Such a gallium nitride type compound semiconductor is (1) a semiconductor comprising a compound of Ga of group III element and N of group V element, or (2) a semiconductor which comprises a gallium nitride compound in which a part of Ga is substituted by other group III elements such as Al or In and/or a part of N is substituted by other group V element such as P or As.

According to a semiconductor memory device of the present invention, a light emitting element for erasing stored information is provided in a package of the semiconductor memory device, in which only by turning on the light emitting element by an external electric signal, stored information can be erased and thus stored information can be easily rewritten electrically. In addition, the light emitting element together with a light insulating wall is provided in each memory cell array region, whereby stored information can be erased for each block.

DETAILED DESCRIPTION

Figure 1:
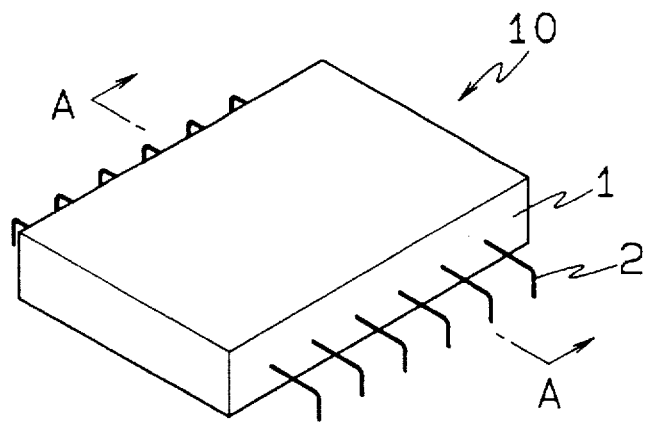
FIG. 1 is a perspective view of one example of an ultraviolet irradiation type semiconductor memory device of the present invention.
Figure 6:
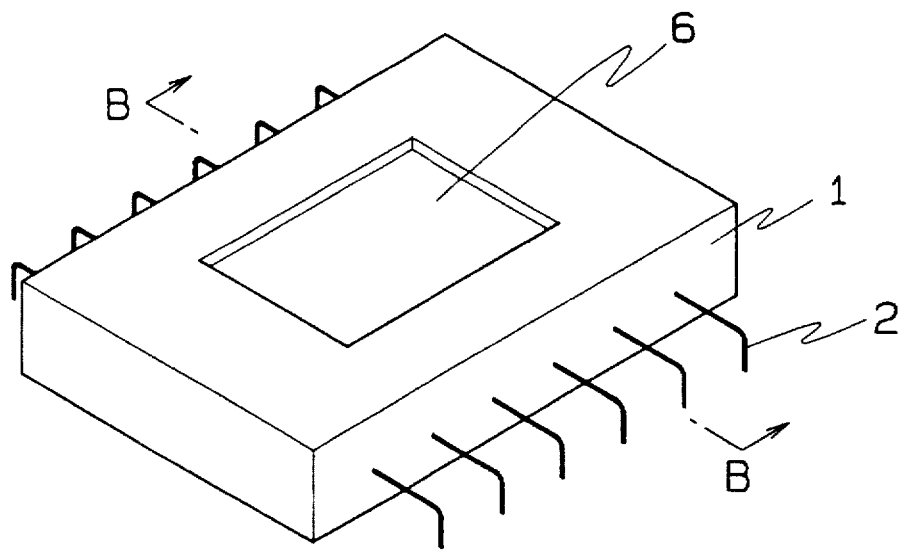
FIG. 6 is a view showing a conventional EPROM package.
Figure 7:
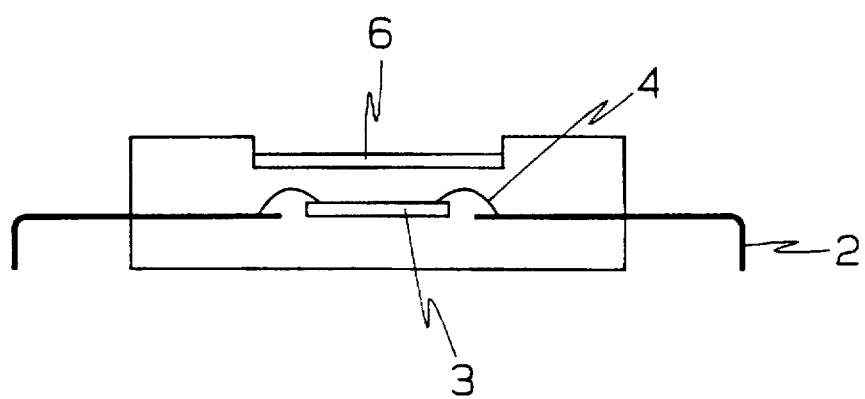
FIG. 7 is a sectional view showing a conventional EPROM package taken along the line B—B of FIG. 6.

With referring to the drawings, a semiconductor memory device of the present invention will be explained hereinafter. FIG. 1 shows a schematic illustrative view of an EPROM package which is one embodiment of a semiconductor memory device according to the present invention. This device employs the same package made of a opaque resin such as an epoxy resin or the like, as that in which a common semiconductor chip is encapsulated, but has no window 6 for ultraviolet ray irradiation as shown in FIG. 6 which shows the appearance of a corresponding, conventional EPROM package.

Figure 2:
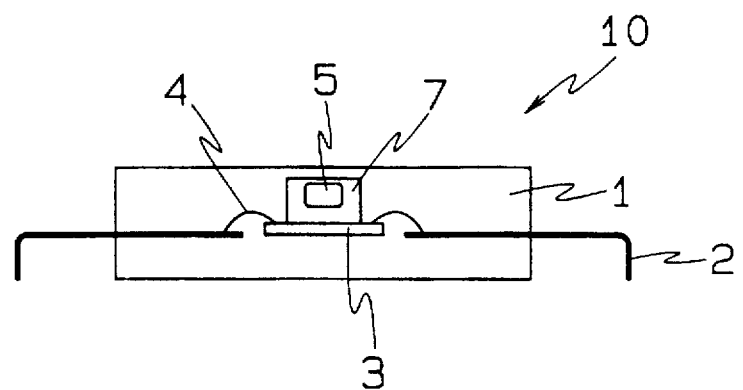
FIG. 2 is a cross-sectional illustrative view of one example of a semiconductor memory device of the present invention.
Figure 3:
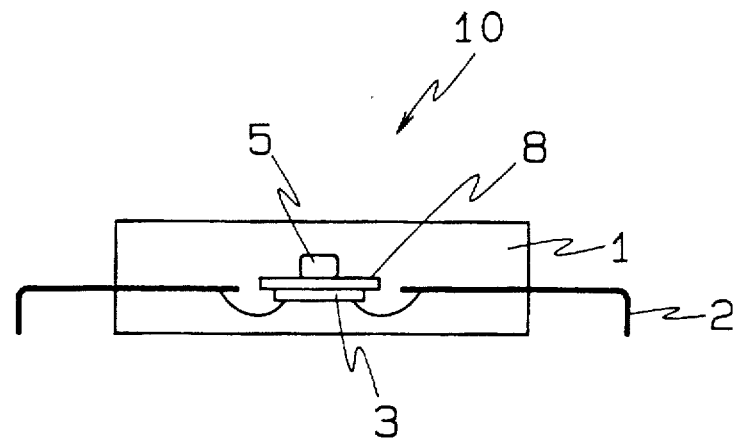
FIG. 3 is a cross-sectional illustrative view of another example of a semiconductor memory device of the present invention.
Figure 4:
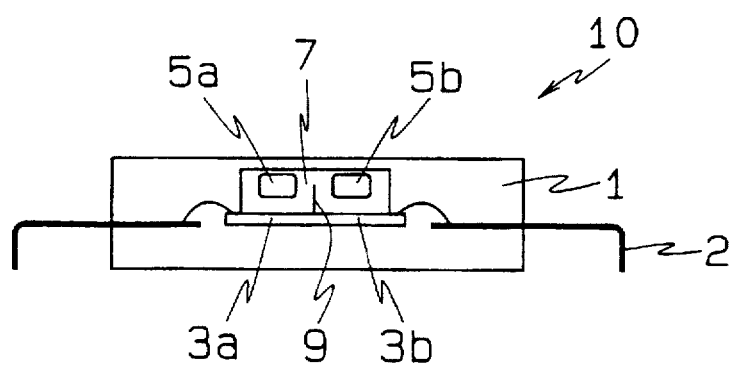
FIG. 4 is a cross-sectional illustrative view of still another example of a semiconductor memory device of the present invention.

FIGS. 2 through 4 are cross-sectional illustrative views taken along the line A—A of FIG. 1 in different embodiments of a semiconductor memory device of the present invention. As shown by these cross-sectional illustrative views, a semiconductor memory 10 according to the present invention includes a semiconductor chip 3 in which memory cells are arrayed, and a light emitting element 5 (or 5a and 5b) in the package.

Heretofore, an LED for blue light has had a lower luminance than that an LED for red light and an LED for green light and thus had a weakness for practical use.

However, recently employing a gallium nitride type compound semiconductor, a low-resistant p-type semiconductor layer doped with Mg has been obtained, so that the LED for blue light has improved luminance thereof and has attracted the attention of those skilled in the art. The present invention is characterized in that the semiconductor in which memory cells are formed and the light emitting element are housed in the same package so that the information stored in the memory cells can be electrically erased by the light emitting element such as the LED for blue light or a semiconductor laser, and so that the information can be rewritten.

The LED using the above-mentioned gallium nitride type compound semiconductor emits light having a wavelength of approximately 370 to 480 nm, so that the light is longer in wavelength than (but the energy is lower than) that of ultraviolet rays used for erasing all together in the conventional EPROM. However, the present inventors concentrated their energy on the study. As a result, it was found that by using an LED having a high luminance of approximately 0.1 to 1 candela (cd) or a laser diode having an output of about 0.1 mW to about 1 mW, sufficiently stored information can be erased.

Figure 5:
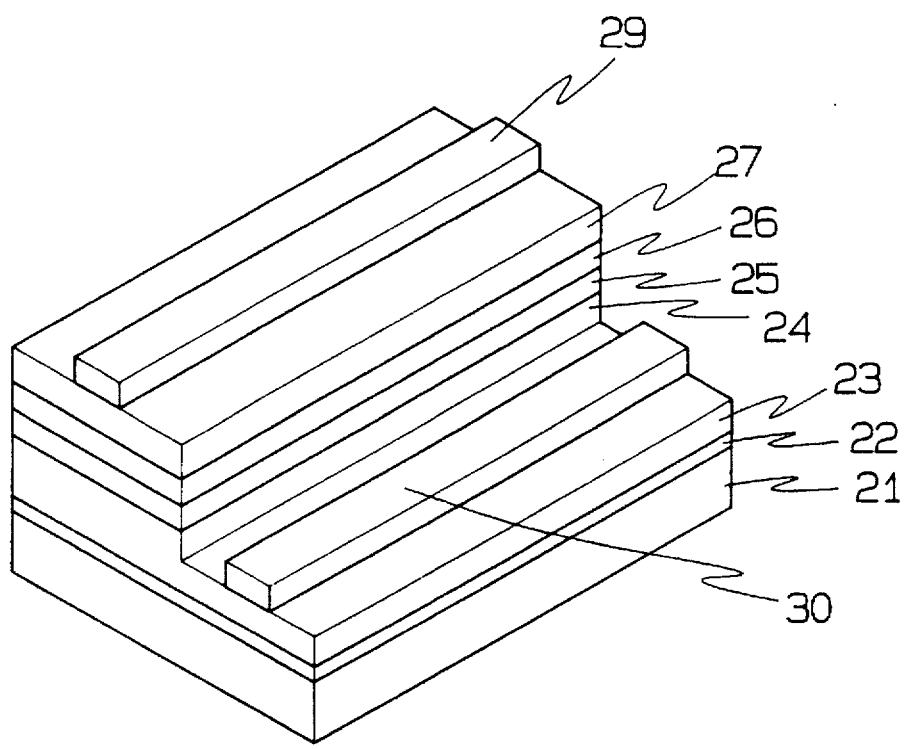
FIG. 5 is a perspective view of one example of an LED chip using a gallium nitride type compound semiconductor.

The LED using such a gallium nitride type compound semiconductor is manufactured in a manner described below. FIG. 5 shows a perspective view of a completed LED chip using gallium nitride type compound semiconductor.

Trimethylgallium (hereinafter referred to as "TMG") as an organometallic compound gas, ammonia has (NH$_3$), and SiH$_4$ or the like as a dopant together with carrier gas H$_2$ are supplied on a substrate 21 comprising sapphire (single crystal of Al$_2$O$_3$) at a low temperature of 400° to 700° C. by means of the metal organic chemical vapor deposition method (hereinafter referred to as "MOCVD" method) to form a low-temperature buffer layer 22 comprising, for example, an n-type GaN layer by approximately 0.01 to 0.2 µm, and then the same gas is supplied to the substrate at a high temperature of 700° to 1200° C. to form a high-temperature buffer layer 23 comprising the same composition of the n-type GaN layer by approximately 2 to 5 µm.

Then, a gas of trimethylaluminium (hereinafter referred to as "TMA") is further supplied to the above-mentioned gas to form an n-type Al$_x$Ga$_{1-x}$N (0<X<1) layer including Si as an n-type dopant, thereby forming an n-type cladding layer 24 for double hetero junction formation by approximately 0.1 to 0.3 µm. The n-type layer is formed as n-type because even if SiH$_4$ or the like as a dopant is not added, N (nitrogen) is easy to evaporate when GaN layer or the like is deposited.

Then, instead of the above-mentioned gas of TMA, trimethylindium (hereinafter referred to as "TMI") is introduced to form an active layer 25 comprising a material, the band gap energy of which is smaller than that of the cladding layer, for example, Ga$_y$In$_{1-y}$N (0<y≦1) by approximately 0.05 to 0.1 µm.

Further, using the same gas as used to form the n-type cladding layer 24, bis(cycropentadienel)magnesium (hereinafter referred to as "CP$_2$Mg") or dimethylzinc (hereinafter referred to as "DMZn") for Mg or Zn as a p-type impurity gas instead of SiH$_4$ is added and introduced into a reactive tube to allow a p-type Al$_x$Ga$_{1-x}$N layer as a p-type cladding layer 26 to be formed by vapor deposition. This causes a double hetero junction to be formed by the n-type cladding layer 24, the active layer 25 and the p-type cladding layer 26.

Then, to form a cap layer 27, the same gas as for the above-mentioned buffer layer 23, and CP$_2$Mg or DMZn as an impurity gas is supplied to allow a p-type GaN layer to be deposited by approximately 0.3 to 2 µm.

Thereafter, a protective film such as SiO$_2$ and Si$_3$N$_4$ is provided on the entire surface of the deposit layer of the semiconductor layer, and annealing or electron beam irradiation at 400° to 800° C. for about 20 to 60 minutes is performed to activate the p-type cladding layer 26 and the cap layer 27.

Then, after the protective film is removed, a resist is applied to perform patterning so as to form an n-side electrode, and a part of each deposited semiconductors is removed by means of dry etching to allow the buffer layer 23 as an n-type GaN layer to be exposed. Then, a p-side electrode 30 and an n-side electrode 29 are formed by means of sputtering, and then dicing is performed to form LED chips.

Also, the semiconductor chip in which memory cells array are formed in such a semiconductor chip as a conventional PROM obtained by forming into matrix shape a MOS type FET in which a film comprising dielectrics for trapping electrons or positive holes is provided on a gate insulating film, or a MOS type FET in which a floating gate comprising a metallic film is provided in an insulating film.

With reference to embodiments having a specific structure, a semiconductor memory device according to the present invention will be explained in detail hereinafter.

EXAMPLE 1

This example shows a semiconductur memory device in which a semiconductor chip having an array of memory cells faces to a light emitting element.

First, referring to FIG. 2, a semiconductor chip 3 is provided by die bonding on a lead frame and connected by wire bonding by a wire 4 to a lead wire 2. Also, a light emitting element 5 faces to memory cells, and each electrode terminals of the light emitting element 5 is also connected by wire bonding to the lead wire of the lead frame to effect electrical connection. A transparent resin 7 comprising an epoxy resin or the like and is transparent to the light from the light emitting element 5 is potted on an area in which the semiconductor chip 3 faces to the light emitting element 5. Then, the connecting portion and entire periphery of the resin are molded and sealed, as with an ordinary package for a semiconductor device, by a nontransparent resin 1 comprising a molding resin such as an epoxy resin or the like and is opaque to the light from the light emitting device.

The completed semiconductor memory device 10 is mounted by using the lead wire 2 to a printed board. An initial writing of information is preformed by an electric signal input through the lead wire 2 in a similar manner to a conventional memory device. In order to rewrite the information electrically, first the light emitting element 5 is allowed to emit a light so as to irradiate the semiconductor chip 3 having an array of memory cells, thereby erasing once all the written information. Subsequently, another information is written in the same manner as the initial information to complete rewriting.

EXAMPLE 2

FIG. 3 shows another example of a semiconductor memory device of the present invention. In this example, the semiconductor chip 3 is bonded to the reverse side of a substrate 8 of the light emitting element 5. That is, the light emitting device 5 using gallium nitride type compound semiconductor is formed on a transparent substrate such as sapphire, as described above, so that a light is also emitted from the backside of the substrate. For this reason, by providing the surface of the memory cell of the semiconductor chip 3 on the reverse side of the sapphire substrate 8, erasing can be performed by the light from the light emitting device 5. Now, the wire bonding between the semiconductor chip 3 and the lead wire 2, the wire bonding between the light emitting element 5 and the lead wire, and molding by an opaque resin is as with the Example 1. In this case, the wire bonding between the semiconductor chip 3 and the light emitting element 5 is performed on both the surface and the back of the lead frame. The writing and erasing of information are performed in a similar manner to the above-mentioned in the Example 1.

EXAMPLE 3

In Examples 1 and 2, only one light emitting element 5 is provided, while in this example, a plurality of light emitting elements 5 are provided, so that light intensity can be enhanced, a light for erasing stored information can reach to a wide region of semiconductor chips, and erasing can be performed for each region of memory cells. FIG. 4 is one example of a case where a plurality of light emitting elements are provided, in which light emitting elements 5a and 5b in FIG. 4 are shown. In this example, a light insulating wall 9 is provided between these light emitting elements 5a and 5b, so that stored information on array regions 3a and 3b of different memory cells of the semiconductor chip 3 is erased by the light emitting elements 5a and 5b, respectively. The light emitting elements 5a and 5b are operated separately, thereby allowing the information for each predetermined region of the memory cell array to be rewritten electrically. The other configuration is the same as that of the example 1.

According to the semiconductor memory device of the present invention, a semiconductor memory comprising a conventional, inexpensive EPROM can be erased only by an electric signal to effect rewriting. Also, the resin encapsulating technique used commonly in the semiconductor manufacturing technique, as it is, can be utilized for packaging, thereby contributing to an improved durability and a reduced manufacturing cost. As a result, reliability is improved, thereby allowing a high performance semiconductor memory device to be obtained at a low cost.

Though several embodiments of the present invention are described above, it is to be understood that the present invention is not limited only to the above-mentioned, various changes and modifications may be made in the invention without departing from the spirit and scope thereof.

What is claimed is:

1. A semiconductor memory device comprising:
   (a) a semiconductor chip having an array of memory cells, stored information in said memory cells being erasable by light irradiation;
   (b) a light emitting element irradiating a light into said memory cells portion of said semiconductor chip; and
   (c) a package in which said semiconductor chip and said light emitting element are encapsulated with a resin in one body, wherein two or more elements of said light emitting element are encapsulated.

2. The semiconductor memory device of claim 1, wherein a light emitting surface of said light emitting element faces to said memory cells, wherein a first region between said light emitting surface and said memory cells is filled with a transparent resin, and wherein a second region surrounding said first region and said semiconductor chip and said light emitting element are encapsulated with a resin opaque to the light from said light emitting element.

3. The semiconductor memory device of claim 1, wherein said elements are arranged so that a light from each of said elements is irradiated to each of parts of said memory cells, and wherein a light insulating cell is provided so that lights from said elements are not intersected with each other.

4. The semiconductor memory of claim 1, wherein said light emitting element is a light emitting diode comprising a gallium nitride type compound semiconductor, said light emitting diode radiating a light, the wavelength of which is 370 to 480 nm.

5. A semiconductor memory device comprising:
   (a) a semiconductor chip having an array of memory cells, stored information in said memory cells being erasable by light irradiation;
   (b) a light emitting element irradiating a light into said memory cells portion of said semiconductor chip, wherein said light emitting element is a light emitting diode comprising a gallium nitride type compound semiconductor, said light emitting diode radiating a light, the luminance of which is 0.1 to 1 candela; and
   (c) a package in which said semiconductor chip and said light emitting element are capsulated with a resin in one body.

6. A semiconductor memory comprising:
   (a) a semiconductor chip having an array of memory cells, stored information in said memory cells being erasable by light irradiation;
   (b) a light emitting element irradiating a light into said memory cells portion of said semiconductor chip, wherein said light emitting element is a laser diode comprising a gallium nitride type compound semiconductor, said laser diode radiating a light, the output of which is 0.1 to 1 mW; and
   (c) a package in which said semiconductor chip and said light emitting element are encapsulated with a resin in one body.

* * * * *